(12) United States Patent
Kim

(10) Patent No.: US 7,795,804 B2
(45) Date of Patent: Sep. 14, 2010

(54) ORGANIC LIGHT EMITTING DISPLAY

(75) Inventor: Changnam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 936 days.

(21) Appl. No.: 11/642,851

(22) Filed: Dec. 21, 2006

(65) Prior Publication Data
US 2007/0159077 A1    Jul. 12, 2007

(30) Foreign Application Priority Data
Dec. 23, 2005 (KR) ............... 10-2005-0129109

(51) Int. Cl.
*H05B 33/00* (2006.01)
(52) U.S. Cl. .............. 313/504; 313/503
(58) Field of Classification Search ............ None
See application file for complete search history.

(56) References Cited

U.S. PATENT DOCUMENTS 7,489,072 B2 * 2/2009 Yang et al. ............... 313/500
2003/0038594 A1 * 2/2003 Seo et al. ............... 313/506
2005/0116236 A1 * 6/2005 Park et al. ............... 257/79
2006/0273715 A1 * 12/2006 Yang et al. ............... 313/504

\* cited by examiner

*Primary Examiner*—Ashok Patel
(74) *Attorney, Agent, or Firm*—Morgan Lewis & Bockius LLP

(57) ABSTRACT

The present invention provides an organic light emitting display comprising: a substrate; thin film transistors positioned on the substrate and comprising a source electrode and a drain electrode; an organic light emitting diode comprising a first electrode connected to the source electrode and the drain electrode of one of the thin film transistors, an emission layer positioned on the first electrode and a second electrode positioned on the emission layer; and a capacitor comprising a first storage electrode positioned on the same layer as the source electrode and the drain electrode, a second storage electrode positioned on the same layer as the first electrode, and an insulating layer positioned between the two storage electrodes.

18 Claims, 3 Drawing Sheets

ORGANIC LIGHT EMITTING DISPLAY

CROSS-REFERENCE

This application claims the benefit of Korean Patent Application No. 10-2005-0129109 filed on Dec. 23, 2005, in the Korean Intellectual Property Office, the disclosure of which is incorporated herein by reference.

BACKGROUND

1. Field

The present invention relates to an organic light emitting display.

2. Related Art

Recently, as multimedia applications and their use increase, the more important the flat panel displays (FPD) become. Hence, various flat panel displays such as a liquid crystal display (LCD), a plasma display panel (PDP) or an organic light emitting display are used more and more. The organic light emitting display has rapid response time, low power consumption, and self-emission structure.

Furthermore, the organic light emitting display has a wide viewing angle, so that it can excellently display a moving picture regardless of the size of the screen or the position of a viewer. Because the organic light emitting display may be manufactured in low temperature environment and by using a semiconductor fabrication process, the organic light emitting display has a simple manufacturing process. Hence, the organic light emitting display is attractive as a next generation display.

Generally, the organic light emitting display emits light by electrically exciting an organic compound. To display a predetermined image, the organic light emitting display has N×M organic light emitting diodes arranged in a matrix format and may be voltage driven or current driven. The driving methods of the organic light emitting display include a passive type and an active type using a thin film transistor.

A pixel circuit of an organic light emitting display in an active type comprises at least a switching transistor, a capacitor, a driving transistor and a light emitting diode. And, the transistors may comprise a semiconductor layer, which is formed of poly-silicon having excellent mobility.

The semiconductor layer comprising the poly-silicon has non-uniformity in grain size so that the difference of threshold voltage occurs among the driving transistors of each pixel circuit. Therefore, the pixel circuit comprises more transistors in order to compensate for it so that the structure of the pixel circuit has been variously changed.

As described above, when a number of transistors are used in order to compensate for the difference of the threshold voltage among each pixel circuit, aperture ratio is significantly reduced. Also, the storage electrodes of a capacitor are mainly formed simultaneously with a semiconductor layer, a gate electrode or a source electrode and a drain electrode of the transistors. However, as the area occupied by the transistors becomes large, the area on which the capacitor is formed reduces, causing a problem that the performance of the capacitor is deteriorated.

SUMMARY

Accordingly, the present invention is provided to substantially obviate one or more problems due to limitations and disadvantages of the related art.

To achieve these and other advantages and in accordance with the purpose of the present invention, there is provided an organic light emitting display. The organic light emitting display comprises: a substrate; thin film transistors comprising a source electrode and a drain electrode; an organic light emitting diode comprising a first electrode connected to the source electrode and the drain electrode of one of the thin film transistors, an emission layer positioned on the first electrode and a second electrode positioned on the emission layer; and a capacitor comprising a first storage electrode positioned on the same layer as the source electrode and the drain electrode, a second storage electrode positioned on the same layer as the first electrode, and an insulating layer positioned between the two storage electrodes.

There is provided an organic light emitting display. The organic light emitting display comprises: a substrate; thin film transistors positioned on the substrate and comprising a gate electrode, a source electrode and a drain electrode and at least two insulating layers positioned between the gate electrode and the source electrode and the drain electrode; and a capacitor comprising a first storage electrode positioned between the insulating layers and a second storage electrode positioned on the same layer as source electrode and the drain electrode.

DESCRIPTION OF THE EMBODIMENTS

Figure 1:
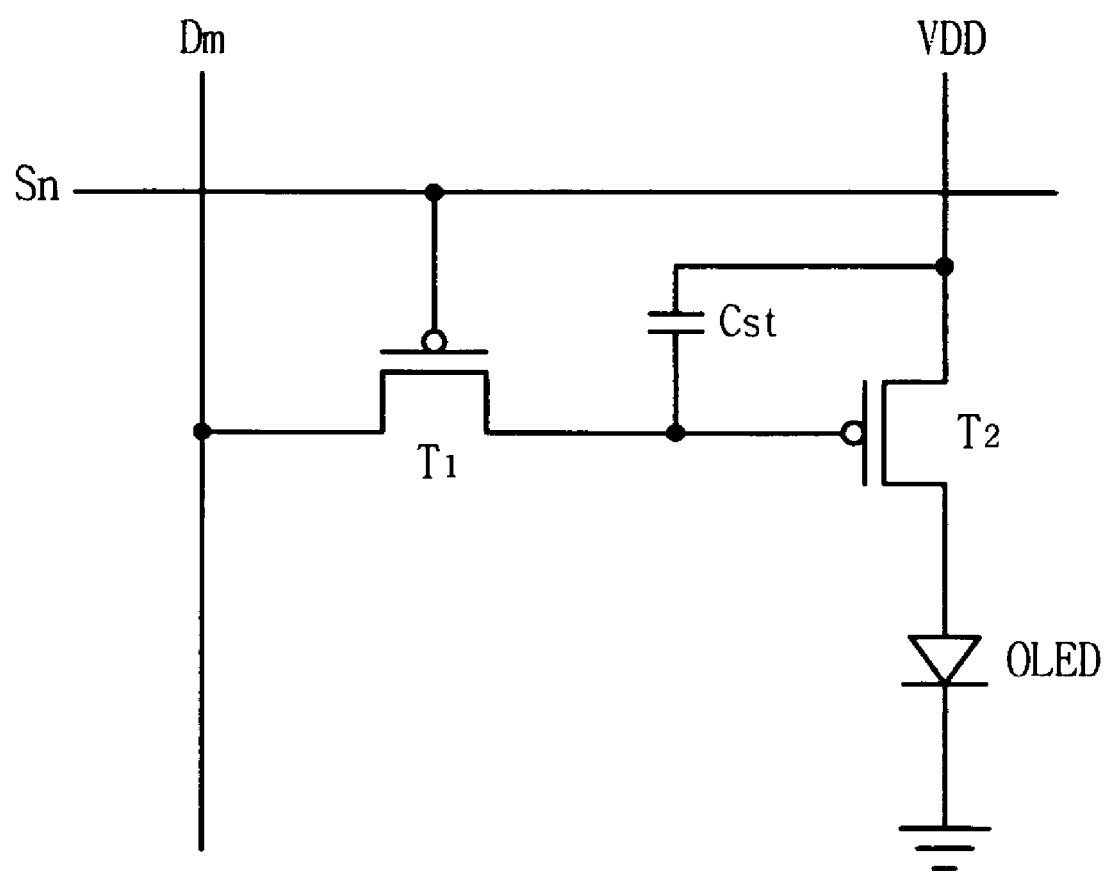
FIG. 1 is a circuit view showing a pixel circuit of a conventional organic light emitting display.

Referring to FIG. 1, a pixel circuit of an organic light emitting display according to a first embodiment of the present invention comprises a switching transistor T1 transferring a data signal from a data line Dm in response to a selection signal from a scan line Sn, a capacitor Cst for storing the data signal received through the switching transistor T1, a driving transistor T2 for generating driving current according to the data signal stored in the capacitor Cst, and an organic light emitting diode OLED for performing the light emitting operation according to the driving current.

The constitution of the organic light emitting display according to the first embodiment of the present invention, for implementing the pixel circuit as shown in FIG. 1, is as follows.

Figure 2:
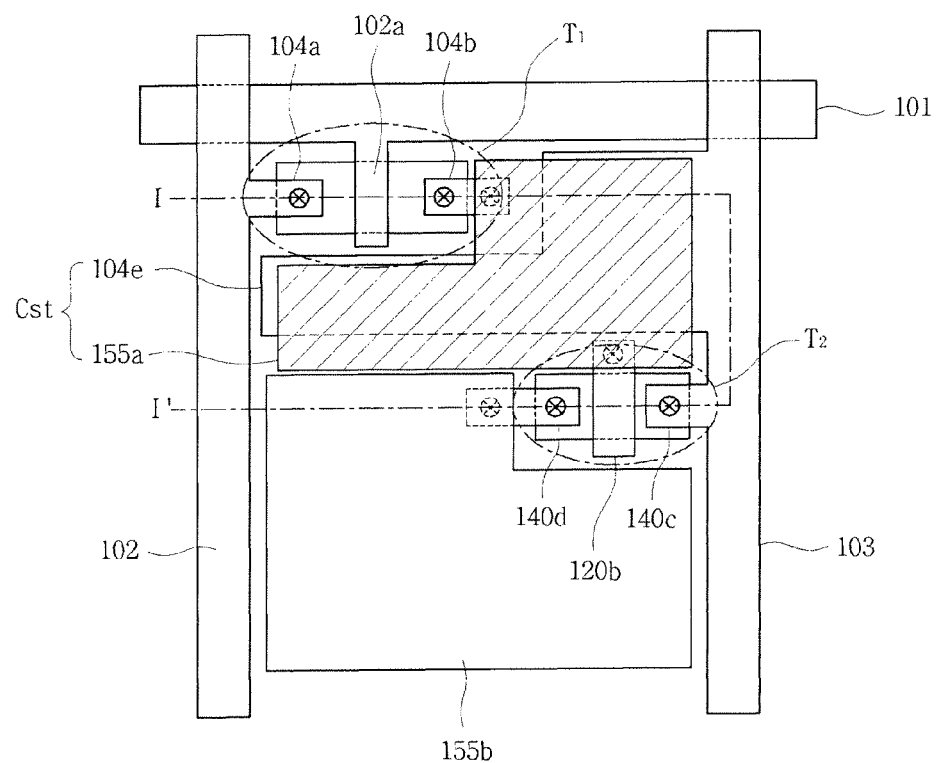
FIG. 2 is a plane view showing an organic light emitting display according to a first embodiment of the present invention.
Figure 3:
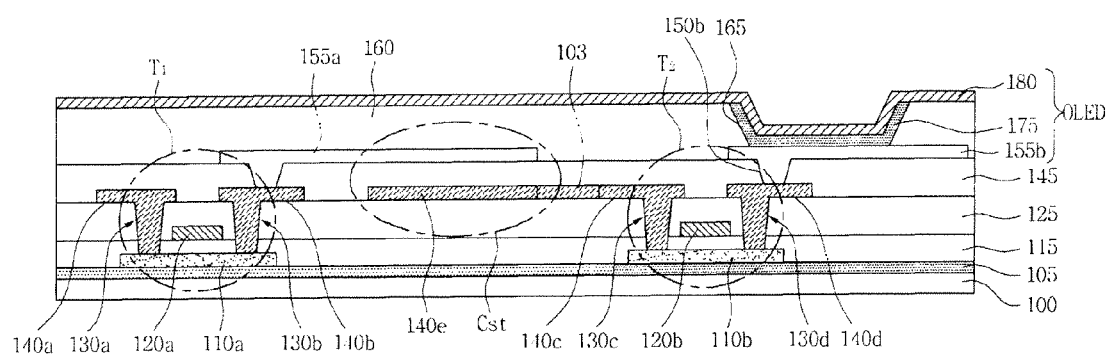
FIG. 3 is a cross-sectional view of the organic light emitting display taken along line I-I' in FIG. 2.
Figure 4:
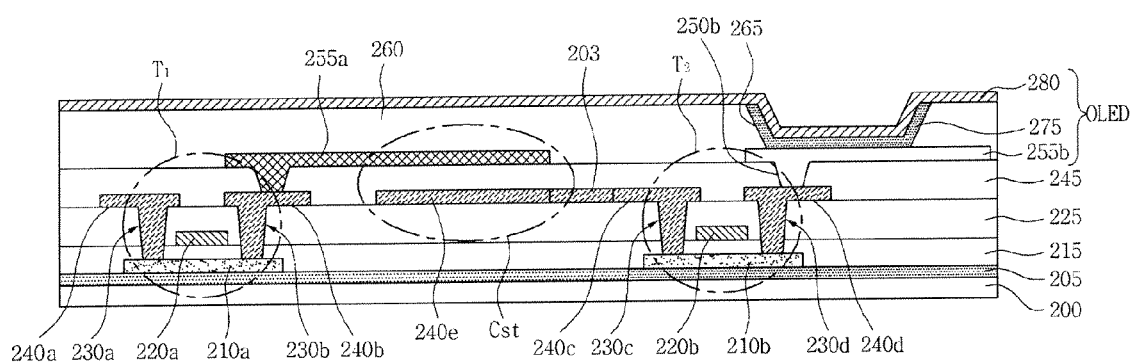
FIG. 4 is a cross-sectional view showing an organic light emitting display according to a second embodiment of the present invention.
Figure 5:
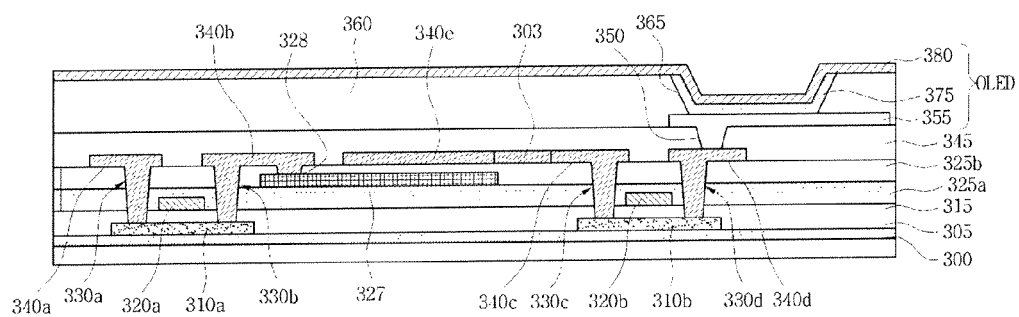
FIG. 5 is a cross-sectional view showing a capacitor of an organic light emitting display according to a third embodiment of the present invention.

Referring to FIGS. 2 and 3, the sub pixel region of the organic light emitting display according to the first embodiment is limited by the intersection of a scan line 101, a data line 102, and a power line 103. And, in the sub pixel region a switching transistor T1, a driving transistor T2, a capacitor Cst and an organic light emitting diode OLED are positioned. Hereinafter, the organic light emitting display according to the first embodiment will be described in more detail with reference to FIG. 3 which is a cross-sectional view taken along line I-I' in FIG. 2.

A buffer layer 105 is positioned on a substrate 100 formed of glass, plastic or metal. The buffer layer 105 is formed to protect a thin film transistor to be formed in a subsequent process from impurities flowed out from the substrate 100, such as alkali ion, etc., wherein it may be selectively formed using silicon oxide SiO2, silicon nitride SiNx, etc.

A first and a second semiconductor layers 110a and 110b are positioned on the buffer layer 105. The first and the second semiconductor layers may comprise amorphous silicon. Also, after forming an amorphous silicon layer on the buffer layer 105, the first and the second semiconductor layers 110a and 110b may crystallize it by using methods of excimer laser annealing (ELA), sequential lateral solidification (SLS), metal induced crystallization (MIC) and metal induced lateral crystallization (MILC) and make it a patterned polycrystalline silicon layer. And, although not shown, the first and the second semiconductor layers 110a and 110b may comprise a source region, a drain region and a channel region.

A first insulating layer 115, which is a gate insulating layer, is positioned to cover the first and the second semiconductor layers 110a and 110b. The first insulating layer 115, which is an insulating layer, may be formed of a silicon oxide film, a silicon nitride film or a double layer thereof.

A first and a second gate electrodes 120a and 120b are positioned on the first insulating layer 115 to correspond to predetermined regions of the first and the second semiconductor layers 110a and 110b. The first and the second gate electrodes 120a and 120b may comprise aluminum (AL), aluminum alloy (AL alloy), molybdenum (Mo), molybdenum alloy (Mo ally), etc. At this time, although not shown in FIG. 3, the scan line 101 is positioned on the same layer as the first and the second gate electrodes 120a and 102b.

A second insulating layer 125 is positioned on the first and the second gate electrodes 120a and 120b, wherein the second insulating layer 125 is an inter-insulating layer. The second insulating layer 125, which is to insulate the first and the second gate electrodes 120a and 120b, and subsequently formed metal lines, such as a source electrode and a drain electrode. The second insulating layer 125 may be configured of a double layer.

A first to a fourth contact holes 130a, 130b, 130c and 130d are positioned in the second insulating layer 125 and the first insulating layer 115, wherein the first to the fourth contact holes 130a, 130b, 130c and 130d expose portions of the first and the second semiconductor layers 110a and 110b.

A first source electrode and a first drain source electrode 140a and 140b, and a second source electrode and a second drain electrode 140c and 140d, are positioned on the second insulating layer 125, wherein the first source electrode and the first drain source electrode 140a and 140b, and the second source electrode and the second drain electrode 140c and 140d are electrically connected to the first and the second semiconductor layers 110a and 110b, respectively, through the first to the fourth contact holes 130a, 130b, 130c and 130d. And, a first storage electrode 140e of the capacitor Cst is positioned on the same layer as the first and the second source electrodes and the drain electrode 140a, 140b, 140c, and 140d.

The first and the second source electrode and drain electrode 140a, 140b, 140c and 140d, and the first storage electrode 140e may be formed on the same layer by performing the same process, and may comprise molybdenum (Mo), tungsten (W), molybdenum tungsten (MoW) and aluminum (AL), etc. And, the first storage electrode 140e may electrically be connected to the second source electrode 140c and the power line 103 of the driving transistor T2. Here, although not shown, the data line 102 may also be formed on the same plane.

A third insulating layer 145 is positioned on the substrate comprising the first and the second source electrode and drain electrode 140a, 140b, 140c and 140d, and the first storage electrode 104e, wherein the third insulating layer 145 is a passivation layer. The third insulating layer 145 may be formed of organic materials such as polyimide, benzocyclobutene series resin and acrylate. The third insulating layer 145 protects elements on the lower thereof and at the same time, remove a height difference generated due to the elements on the lower, making the substrate flat.

A first via hole 150a and a second via hole 150b are positioned in the third insulating layer 145, wherein the first via hole 150a exposes a part of the first drain electrode 140b of the switching transistor T1 and the second via hole 150b exposes a part of the second drain electrode 140d of the driving transistor T2.

And, a second storage electrode 155a of the capacitor and a first electrode 155b of the light emitting diode OLED are positioned on the third insulating layer 145, wherein the second storage electrode 155a is electrically connected to the first drain electrode 140b through the first via hole 150a, and the first electrode 155b is electrically connected to the second drain electrode 140d through the second via hole 150b. Here, the second storage electrode 155a may be positioned to correspond to the first storage electrode 140e.

The second storage electrode 155a and the first electrode 155b may be formed of the same material through the same process. When the first electrode 155b is an anode, the second storage electrode 155a and the first electrode 155b may comprise transparent conductive material with a high work function, such as indium tin oxide. And, when an organic light emitting display according to the first embodiment of the present invention is a top-emission type, the first electrode 155b may comprise a metal layer formed of aluminum etc or silver and a transparent conductive layer. For example, the first electrode 155b may be a multi-layer structure of ITO/Ag/ITO, Ag/ITO, ITO/AlNd/ITO, AlNd/ITO, etc. To the contrary, when an organic light emitting display according to the first embodiment of the present invention is an inverted type, the first electrode 155b may comprise a metal layer formed of aluminum, magnesium or silver, etc.

And, the second storage electrode 155a is electrically connected to the drain electrode 140b of the switching transistor T1. At the same time, although not shown, the second storage electrode 155a may be connected to the gate electrode 120b of the driving transistor T2. Therefore, the capacitor Cst stores signals by the difference between the data signal applied from the switching transistor T1 and the signal applied from the power line 103 by means of the two storage electrodes.

A fourth insulating layer 160 is positioned on the second storage electrode 155a and the first electrode 155b, wherein the fourth insulating layer 160 comprises an opening 165 which exposes a portion of the first electrode 155b. An emission layer 175 is positioned on the first electrode 155 exposed by the opening 165. The emission layer 175 may comprise organic materials, and is supplied with holes and electrons to re-couple them and to form excitons, thereby emitting light. And, although not shown, a hole injecting layer and/or a hole transporting layer may be positioned between the first electrode 155b and the emission layer 175, and an electron transporting layer and/or an electron injecting layer may be positioned on the emission layer 175.

A second electrode 180 is positioned on the substrate comprising the emission layer 175. The second electrode 180 may be a cathode providing an electron to the emission layer 175, and be formed of metal with a low work function, such as magnesium, silver and aluminum. Also, in the case where an organic light emitting display is a top-emission type, the organic light emitting display comprises indium tin oxide or is formed in a thin thickness so that it may be formed in a transflective electrode.

As described above, the organic light emitting display according to the first embodiment of the present invention forms the first storage electrode of the capacitor on the same layer as the source electrode and the drain electrode, and forms the second storage electrode thereof on the same layer as the first electrode.

Since the second storage electrode is formed after all the transistors are formed, a margin in process can be reduced, making it possible to sufficiently secure the area of the storage electrode. Therefore an area of the capacitor is substantially 5 to 80 percent of an area of a sub-pixel comprising the capacitor. It may improve the performance of capacitor.

And, in the case where an organic light emitting display is a bottom-emission type, the second storage electrode is formed on the same layer as the first electrode, having an effect that the aperture ratio is not reduced although the size of the second storage electrode is increased.

Second Embodiment

An organic light emitting display according to a second embodiment of the present invention has the same constitution with that of the organic light emitting display according to the first embodiment of the present invention, except the material for forming a second storage electrode.

In other words, in an organic light emitting display according to the second embodiment of the present invention, a first semiconductor layer 210a, a first insulating layer 215, a first gate electrode 220a, a second insulating layer 225 and a switching transistor T1 comprising a first source electrode and a first drain electrode 240a and 140b electrically connected to the first semiconductor layer 210a through a first and a second contact holes 230a and 230b are positioned on a substrate 200 comprising a buffer layer 205.

Also, a second semiconductor layer 210b, the first insulating layer 215, a second gate electrode 220b, the second insulating layer 225, a driving transistor T2 comprising a second source electrode and a second drain electrode 240c and 240d electrically connected to the second semiconductor layer 210b through a third and a fourth contact holes 230c and 230d are positioned on the substrate 200.

Here, a first storage electrode 240e of the capacitor Cst is positioned on the same layer as the second source electrode 240c in order to be connected to the second source electrode 240c and the power line of the driving transistor T2.

A third insulating layer 245 is positioned on the substrate comprising the first and the second source electrodes and drain electrodes 240a, 240b, 240c and 204d, and the first storage electrode 240e, and a second storage electrode 255a of the capacitor and a first electrode 255b of the light emitting diode OLED are positioned on the third insulating layer 245, wherein the second storage electrode 255a is electrically connected to the first drain electrode 240b through a first via hole 250a, and the first electrode 255b is electrically connected to the second drain electrode 240d through a second via hole 250b. Here, the second storage electrode 255a may be positioned to correspond to the first storage electrode 240e.

In the second embodiment of the present invention, the second storage electrode 255a and the first electrode 255b may be formed of different materials from each other. In other words, when the first electrode 255b is an anode, the first electrode 255b may comprise transparent conductive material with a high work function, such as indium tin oxide. And, the second storage electrode 255a may be formed of metal material having high conductivity, for example, molybdenum, aluminum, silver, copper, tungsten, chrome, etc.

Therefore, after forming a metal material layer on the third insulating layer 245, the second storage electrode 255a is formed by patterning it. Then, after forming again a transparent conductive material layer, the first electrode 255b may be formed by patterning it.

A fourth insulating layer 260 comprising an opening 265 is positioned on the second storage electrode 255a and the first electrode 255b, and an emission layer 275 is positioned in the opening 265. And, a second electrode 280 is positioned on the emission layer 275.

As described above, the organic light emitting display according to the second embodiment of the present invention forms the first storage electrode of the capacitor on the same layer as the source electrode and the drain electrodes, and forms the second storage electrode on the same layer as the first electrode.

Therefore, since the second storage electrode is formed after all the transistors are formed, a margin of process can be reduced, making it possible to sufficiently secure the area of the second storage electrode. Also, in the second embodiment of the present invention, the second storage electrode is formed of metal having high conductivity, making it possible to improve the performance of the capacitor.

Third Embodiment

An organic light emitting display according to a third embodiment of the present invention has the same constitution with that of the organic light emitting display according to the first embodiment of the present invention, except the positions of a first storage electrode and a second storage electrode.

In other words, in an organic light emitting display according to the third embodiment of the present invention, a first and a second semiconductor layers 310a and 310b, a first insulating layer 315, and a first and a second gate electrodes 320a and 320b are positioned on a substrate 300 thereof comprising a buffer layer 305.

And, a second insulating layer 325a is positioned on the first and the second gate electrodes 320a and 320b, and a first storage electrode 327 is positioned on the second insulating layer 325a.

Here, the first storage electrode 327 may be formed of conductive material, and a third insulating layer 325b comprising a first via hole 328 is positioned on the first storage electrode 327, wherein the first via hole 328 exposes a portion of the first storage electrode 327.

And, a first to fourth contact holes 330a, 330b, 330c and 330d are positioned in the first, the second and the third insulating layers 315, 325a and 325b, wherein the first to fourth contact holes 330a, 330b, 330c and 330d expose portions of the first and the second semiconductor layers 310a and 310b, respectively.

A first source electrode and a first drain electrode 340a and 340b are positioned on the third insulating layer 325b, wherein the first source electrode and the first drain electrode 340a and 340b are electrically connected to the first semiconductor layer 310a and 310b. At this time, the first drain electrode 340b may be connected to the first storage electrode 327 through the first via hole 328. And, although not shown, the first storage electrode 327 is electrically connected to the second gate electrode 310b.

And, a second source electrode and a second drain electrode 340c and 340d are positioned on the third insulating layer 325b, wherein the second source electrode and the drain electrode 340c and 340d are electrically connected to the second semiconductor layer 310b. Also, a second storage electrode 340e of the capacitor Cst is positioned on the third insulating layer 325b in order to be connected to the second source electrode 340c and the power line 303 of the driving transistor T2.

Here, the second storage electrode 340e of the capacitor Cst is positioned to correspond to the first storage electrode 327 thereof. And, the second storage electrode may be formed of same material with the first and the second source electrodes and drain electrodes 340a, 340b, 340c and 340d.

A fourth insulating layer 345 is positioned on the substrate comprising the first and the second source electrodes and drain electrodes 340a, 340b, 340c and 340d, and the second storage electrode 340e, and a first storage electrode 355b of the light emitting diode OLED is positioned on the fourth insulating layer 345, wherein the first storage electrode 355b is electrically connected to the second drain electrode 340d through a second via hole 350. The fifth insulating layer 360 comprising an opening 365 is positioned on the first electrode 355b, and an emission layer 375 is positioned in the opening 365. And, a second storage electrode 380 is positioned on the emission layer 375.

As described above, the organic light emitting display according to the third embodiment of the present invention forms the first storage electrode 327 of the capacitor between the second insulating layer 325a and the third insulating layer 325b. Therefore, the constituents of the transistor are not formed on the same layer as the first storage electrode, making it possible to sufficiently secure the area of the first storage electrode. In other words, the capacity of the capacitor can be more improved by widening the area of the electrode of the capacitor.

Although a few embodiments of the present invention have been shown and described with reference to the pixel circuit comprising two transistors and one capacitor, the present invention may be applied to a pixel circuit comprising a number of transistors and capacitors.

And, the first storage electrode or the second storage electrode may be formed of transparent conductive material or opaque metal material according to an emission direction of the organic light emitting display.

What is claimed is:

1. An organic light emitting display comprising:
    a substrate;
    thin film transistors positioned on the substrate and comprising a source electrode and a drain electrode;
    an organic light emitting diode comprising a first electrode connected to the source electrode or the drain electrode of one of the thin film transistors, an emission layer positioned on the first electrode and a second electrode positioned on the emission layer; and
    a capacitor comprising a first storage electrode positioned on the same layer as the source electrode and the drain electrode, a second storage electrode positioned on the same layer as the first electrode, and an insulating layer positioned between the two storage electrodes.

2. The organic light emitting display of claim 1, wherein the source electrode and the drain electrode and the first storage electrode comprise the same material.

3. The organic light emitting display of claim 1, wherein the first electrode and the second storage electrode comprise the same material.

4. The organic light emitting display of claim 3, wherein the first electrode and the second storage electrode comprise a transparent conductive layer.

5. The organic light emitting display of claim 1, wherein the first electrode and the second storage electrode comprise different materials.

6. The organic light emitting display of claim 5, wherein the first electrode comprises transparent conductive material, and the second storage electrode comprises a metal.

7. The organic light emitting display of claim 1, wherein the first storage electrode or the second storage electrode comprises transparent conductive material.

8. The organic light emitting display of claim 1, wherein the first storage electrode is electrically connected to the source electrode of one of the transistors, and the second storage electrode is electrically connected to the gate electrode of the transistor.

9. The organic light emitting display of claim 1, wherein the transistors comprise a switching transistor and a driving transistor, the first storage electrode is electrically connected to the source electrode of the driving transistor, and the second storage electrode is electrically connected to the drain electrode of the switching transistor and the gate electrode of the driving transistor.

10. The organic light emitting display of claim 1, wherein an area of the capacitor is 5 to 80 percent of an area of a sub-pixel comprising the capacitor.

11. An organic light emitting display comprising:
    a substrate;
    thin film transistors positioned on the substrate and comprising a gate electrode, a source electrode and a drain electrode and at least two insulating layers positioned between the gate electrode and the source and drain electrode; and
    a capacitor comprising a first storage electrode positioned between the insulating layers, and a second storage electrode positioned on the same layer as source electrode and the drain electrode.

12. The organic light emitting display of claim 11, wherein the source electrode and the drain electrode and the second storage electrode comprise the same material.

13. The organic light emitting display of claim 11, wherein the first storage electrode or the second storage electrode comprises transparent conductive material.

14. The organic light emitting display of claim 11, wherein the first storage electrode is electrically connected to the gate electrode of one of the transistors, and the second storage electrode is electrically connected to the source electrode of the transistor.

15. The organic light emitting display of claim 11, wherein the transistors comprise a switching transistor and a driving transistor, the first storage electrode is electrically connected to the drain electrode of the switching transistor and the gate electrode of the driving transistor, and the second storage electrode is electrically connected to the source electrode of the driving transistor.

16. The organic light emitting display of claim 11 comprising: an organic light emitting diode comprising a first electrode connected to the source electrode or the drain electrode of one of the thin film transistors, an emission layer positioned on the first electrode and a second electrode positioned on the emission layer.

17. The organic light emitting display of claim 11, wherein the thin film transistor comprising a semiconductor layer positioned under the gate electrode and a gate insulating layer positioned between the semiconductor layer and the gate electrode.

18. The organic light emitting display of claim 11, wherein an area of the capacitor is 5 to 80 percent of an area of a sub-pixel comprising the capacitor.

* * * * *